US008865062B2

(12) United States Patent
Ueshima et al.

(10) Patent No.: US 8,865,062 B2
(45) Date of Patent: Oct. 21, 2014

(54) HIGH-TEMPERATURE LEAD-FREE SOLDER ALLOY

(75) Inventors: Minoru Ueshima, Matsudo (JP); Rei Fujimaki, Koshigaya (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 13/261,682

(22) PCT Filed: Aug. 8, 2012

(86) PCT No.: PCT/JP2012/070185
§ 371 (c)(1),
(2), (4) Date: Jun. 27, 2013

(87) PCT Pub. No.: WO2014/024271
PCT Pub. Date: Feb. 13, 2014

(65) Prior Publication Data
US 2014/0044479 A1    Feb. 13, 2014

(51) Int. Cl.
*C22C 30/04*    (2006.01)

(52) U.S. Cl.
USPC .......................... 420/561; 420/587; 420/589

(58) Field of Classification Search
USPC ......................... 420/587, 561, 589
See application file for complete search history.

(56) References Cited

FOREIGN PATENT DOCUMENTS

| JP | 2003290976 | 10/2003 |
|---|---|---|
| JP | 2004298931 | 10/2004 |
| JP | 2005340267 | 12/2005 |
| JP | 2005340268 | 12/2005 |
| JP | 2007152385 | 6/2007 |
| JP | 2007152385 A * | 6/2007 |

* cited by examiner

*Primary Examiner* — Roy King
*Assistant Examiner* — Janelle Morillo
(74) *Attorney, Agent, or Firm* — Michael Tobias (57) ABSTRACT

A Sn—Sb—Ag—Cu based high-temperature lead-free solder alloy which has excellent connection reliability and which does not form a low melting point phase even when solidified by slow cooling is provided. It has an alloy composition consisting essentially of, in mass percent, Sb: 35-40%, Ag: 13-18%, Cu: 6-8%, and a remainder of Sn.

17 Claims, 3 Drawing Sheets

HIGH-TEMPERATURE LEAD-FREE SOLDER ALLOY

TECHNICAL FIELD

This invention relates to a Sn—Sb—Ag—Cu based high-temperature lead-free solder alloy.

BACKGROUND ART

In recent years, a higher level of properties is being demanded of semiconductors, and their environments of use are becoming increasingly severe. Therefore, although Si was used in the past as a material for semiconductor elements (referred to as Si semiconductor elements), SiC, GaAs, GaN, and the like are now being used. Below, these semiconductor elements will be referred to as SiC semiconductor elements, GaAs semiconductor elements, and Ga Semiconductor elements, respectively. Because semiconductor elements made of SiC, GaAs, and GaN have superior properties such as excellent pressure resistance, an increased operating temperature, and an enlarged band gap, they are being applied to power transistors and optical devices such as LEDs. These semiconductor elements, which are referred to as next-generation semiconductors, can operate at a high temperature, and solder joints used therein may reach 250-280° C. Accordingly, these next-generation semiconductors require a high-temperature solder.

In general, a semiconductor element is connected to a heat sink such as a metal core or a ceramic plate for heat dissipation. High-temperature solders are also used for such applications.

Several high-temperature solders are already known. An example of such conventional high-temperature lead-free solders is an Au-20Sn solder alloy, which has a eutectic Au—Sn alloy composition. Because an Au-20Sn solder alloy has a eutectic temperature of 280° C., it can be used at temperatures from at least 250° C. to less than 280° C. However, it is an extremely expensive material.

Examples of less expensive high-temperature lead-free solder alloys include Sn—Sb based solder alloys, Bi based solder alloys, Zn based solder alloys, and Ag-containing sintered alloys. Among these, Sn—Sb based solder alloys are superior to Bi based or Zn based solder alloys and Ag-containing sintered alloys from the standpoints of thermal conductivity, corrosion resistance, and bonding strength.

Patent Documents 1-3 disclose Sn—Sb—Ag—Cu solder alloys in which Ag and Cu are added to a Sn—Sb solder alloy as high-temperature solder alloys which can be used in a temperature range of 250-280° C.

Namely, Patent Document 1 discloses a Sn—Sb—Ag—Cu solder alloy having a solidus temperature exceeding 300° C. which is achieved by focusing on the ratio of Sn and Sb.

Similar to Patent Document 1, Patent Document 2 discloses a Sn—Sb—Ag—Cu solder alloy having a solidus temperature exceeding 300° C.

PRIOR ART DOCUMENTS

Patent Documents

Patent Document 1: JP 2005-340267 A
Patent Document 2: JP 2007-152385 A
Patent Document 3: JP 2005-340268 A

SUMMARY OF THE INVENTION

It was found that at the time of cooling of a Sn—Sb based solder alloy after soldering, a low melting point phase which starts to melt at 230-240° C. is formed in a soldered portion (also referred to as a solder joint) due to segregation during solidification (solidification segregation).

As a result, if such a low melting point phase is present in a solder joint which is formed using a Sn—Sb based solder alloy, the low melting point phase melts at 250-280° C., which is the operating temperature for a semiconductor element, and forms a low strength portion in which a solid and liquid coexist in the solder joint. If a load is applied to this low strength portion, cracks develop, and the solder joint may fracture.

The above-described low melting point phase occurs more readily when the cooling rate at the time of solidification is slow. A recent technological trend in soldering sometimes employs a quite low cooling rate such as 1° C. per second in usual reflow soldering. In this description, this cooling will be collectively referred to for convenience as slow cooling. The cooling rate at the time of soldering is usually assumed to be approximately 0.8-50° C. per second.

In a semiconductor device in which a high-temperature solder is used, thermal stresses are applied to solder joints due to thermal strains of substrates and semiconductor parts, which are caused by heat generation by semiconductor elements themselves. Accordingly, when the above-described low melting point phase is present, there is the possibility of a serious problem in the form of fracture of the joint interface starting at the low melting point phase which melted due to heat generation by the semiconductor elements. This is not a matter of the extent to which a low melting point phase has formed. Rather, there is a greatly increased possibility of the occurrence of this problem even when a small amount of a low melting point phase is present. Thus, there is a demand for a high-temperature lead-free solder alloy which does not form a low melting point phase even if it solidifies by slow cooling and which has excellent connection reliability.

In general, the cooling rate of molten solder in a soldering apparatus is limited to a certain range by the specifications of the apparatus, and it is not an operational factor which is controlled each time soldering is performed. Excessively rapid cooling may impart an unnecessary thermal stress to electronic equipment undergoing soldering.

Patent Document 1 discloses a high-temperature solder. The examples in that document disclose a solder alloy containing 11 mass % of Ag. Because the solder alloy disclosed in Patent Document 1 has a low Ag content of 11 mass %, the formation of a low melting point phase cannot be avoided when soldering is carried out under the above-described slow cooling conditions. Therefore, a solder joint formed from a solder alloy described in that document partially melts when used at 240° C. or above and has problems with respect to connection reliability due to the possibility of fracture of the joint which is caused by a reduction in strength of the half-molten portion.

The examples in Patent Document 2 disclose solder alloys having an Ag content of 15 weight % but a Cu content of only 4 weight %. If the solder alloys described in that document are used for soldering, because the Cu content is low, there is the possibility of fracture of solder joints in the same manner as with the solder alloy described in Patent Document 1.

Thus, when the solder alloys described in Patent Documents 1 and 2 form a solder joint, a low melting point phase which is formed sometimes segregates inside the solder alloy structure constituting the solder joint.

The term "connection reliability" of a solder joint herein used means that fracture of the solder joint does not take place during operation of a semiconductor device. In this description, it is the property that is evaluated by whether the above-described low melting point phase is formed or not.

An object of the present invention is to provide a Sn—Sb—Ag—Cu based high-temperature lead-free solder alloy which does not form a low melting point phase during soldering and which has excellent connection reliability.

Specifically, an object of the present invention is to provide a Sn—Sb—Ag—Cu based high-temperature lead-free solder alloy which can form a solder joint in which the temperature at the start of melting is at least 280° C.

As a result of detailed investigation, the present inventors found that a low melting point phase is not formed at all during soldering by precisely controlling the contents of Ag and Cu in a Sn—Sb—Ag—Cu based high-temperature lead-free solder alloy, and they completed the present invention.

The present invention is as follows.

(1) A high-temperature lead-free solder alloy having an alloy composition consisting essentially, in mass percent, of Sb: 35-40%, Ag: 13-18%, Cu: 6-8%, and a remainder of Sn.

(2) A high-temperature lead-free solder alloy as set forth above in (1) further containing, in mass percent, Ni: 0.01-0.1%.

(3) A high-temperature lead-free solder alloy as set forth above in (1) or (2) wherein the ratios of the contents of the alloy composition satisfy the following Equations (I)-(III):

$$2.20 \leq Sb/Ag \leq 2.75 \quad \text{(I)}$$

$$4.90 \leq Sb/Cu \leq 6.20 \quad \text{(II)}$$

$$2.05 \leq Ag/Cu \leq 2.55 \quad \text{(III)}$$

(4) A solder joint using a high-temperature lead-free solder alloy as set forth above in any of (1)-(3) wherein the proportion of solid phases at 280° C. is 100%.

(5) A preform comprising a high-temperature lead-free solder alloy as set forth above in any of (1)-(3).

(6) A solder paste containing a solder powder of a high-temperature lead-free solder alloy as set forth above in any of (1)-(4) and a flux.

Patent Document 3 describes an alloy composition which does not melt even at 260° C., but there is no disclosure whatsoever concerning the proportion of solid phases at 280° C. That document also discloses an alloy which has an Ag content of 12% by weight, but that alloy contains 10% by weight of Cu. The solder alloy may form a low melting point phase having a solidus temperature of 230-240° C. as is the case with the solder alloys described in Patent Documents 1 and 2.

MODES FOR CARRYING OUT THE INVENTION

The present invention will be explained in greater detail. In this description, percent with respect to the composition of a solder alloy means mass percent unless otherwise indicated.

A Sn—Sb—Ag—Cu based solder alloy according to the present invention contains 13-18% of Ag and 6-8% of Cu, so it does not form a low melting point phase after soldering, and it exhibits excellent connection reliability even when a semiconductor element is operated at a high temperature of around 250-280° C.

A low melting point phase referred to herein is a solidified phase which has a melting point of 210-250° C. and which develops due to solidification segregation at the time of cooling after soldering with a solder alloy. In general, solidification segregation is a phenomenon which occurs when a molten phase solidifies due to a difference between the composition of the portion which first solidifies and the composition of the portion which finally solidifies, thereby causing specific components to segregate. Solidification segregation occurs more readily as the cooling rate decreases. Particularly with a lead-free solder alloy containing a large amount of Sn, a single-Sn phase (a phase made solely of Sn) which has a low melting point easily segregates. From this standpoint, the present invention is characterized in that the formation of a low melting point phase which is thought to predominantly comprise a single-Sn phase is suppressed in a solder joint.

The reason why the low melting point phase predominantly comprises a single-Sn phase is that the temperature at which the low melting point phase starts to melt or the melting temperature of this phase is close to 232° C., which is the melting point of Sn. The remainder of the low melting point phase is thought to be constituted by phases such as Sb2Sn3 having a melting point of around 240° C., and by a residual phase having a composition close to a Sn—Ag—Cu eutectic composition and having a melting point of around 220-230° C. Therefore, the temperature at the start of melting of the low temperature phase, which is the melting point of this phase, is in the range of 210-250° C. A low melting point phase forms at least with an alloy composition in which the Sn content exceeds the total content of Sb, Ag, and Cu. Namely, it forms at least in the case in which Sb+Ag+Cu<Sn. A low melting point phase forms when Ag is 11% and Cu is 4% as in Patent Documents 1 and 2. However, when an alloy contains 13-18% of Ag and 6-8% of Cu as in the present invention, the formation of a low melting point phase is suppressed. This is thought to be because, as described below, Sb, Ag, and Cu preferentially form intermetallic compounds with Sn at the time of solidification, and these intermetallic compounds form a high melting point phase, although the exact mechanism is unclear.

A high melting point phase is a solidified phase comprising intermetallic compounds having a melting point of at least 290° C. such as Cu6Sn5, Cu3Sn, Ag3Sn, SnSb, and Ni3Sn4.

A solder joint made from a solder alloy according to the present invention has these intermetallic compounds which constitute a high melting point phase. It may contain intermetallic compounds which are not listed above as long as they have a melting point of at least 290° C. Namely, a solder alloy joint according to the present invention consists essentially of solidified phases having a melting point of at least 290° C. Because a solder joint made from a solder alloy according to the present invention consists essentially of high melting point phases, it exhibits excellent connection reliability.

The temperature at the start of melting is detected from a DSC (differential scanning calorimeter) curve, and it is the temperature at the start of endotherm (heat absorption) for the initial endothermic peak and corresponds to the solidus temperature. The initial endothermic peak is taken from the endothermic peaks having an area ratio of at least 0.1% with respect to the total area of all the endothermic peaks measured on a DSC curve. Any endothermic peaks having an area ratio of less than 0.1% are not considered to be an endothermic peak in the present invention since they may probably be peaks not attributable to the alloy composition such as a noise at the time of measurement.

The temperature at the completion of melting is the temperature at the completion of endotherm of an endothermic peak detected at a temperature of at least 280° C. on a DSC curve and it correspond to the liquidus temperature.

The reasons why the alloy composition of a solder alloy according to the present invention is determined as set forth above are as follows.

The Sb content is 35-40%. Sb promotes the formation of SnSb, which constitutes a high melting point phase. Accordingly, Sb suppresses the formation of a low melting point phase and raises the temperature at the start of melting. In addition, Sb has a tendency to lower the surface tension of a solder alloy, so it increases wettability. If the Sb content is less than 35%, it is not possible to exhibit the effect of suppressing the formation of a low melting point phase and wettability worsens. If the Sb content exceeds 40%, the temperature at the completion of melting becomes extremely high and solderability worsens. The Sb content is preferably 36-40% and more preferably 37-40%.

The Ag content is 13-18%. Ag has the effect of suppressing the temperature at the completion of melting to at most 380° C. By forming an intermetallic compound with Sn (Ag3Sn), Ag suppresses the formation of a low melting point phase and increases the strength of a solder alloy. In addition, Ag can lower the surface tension in a temperature range up to 400° C., thereby improving wettability and increasing the strength of the solder alloy.

If the Ag content is less than 13%, it is not possible to exhibit the effects of the addition of Ag. If the Ag content is greater than 18%, Sb and Ag preferentially form an Ag3Sb phase, and an Ag3Sb phase appears in the initial stage of solidification. As a result, a low melting point phase easily forms in a solder alloy.

If Sb and Ag form a precipitated phase in the initial stage of solidification, the concentrations of Sb and Ag in the liquid phase which remains in the course of solidification of a solder alloy become relatively low. If the concentrations of Sb and Ag in the remaining liquid phase decrease, the effects of Sb and Ag of to suppressing the formation of a low melting point phase decrease, and a low melting point phase having a melting point of 250° C. or below is formed. As a result, the heat resistance of the solder alloy deteriorates. The Ag content is preferably 14-18% and more preferably 15-18%.

The Cu content is 6-8%. Cu has an effect of suppressing the temperature at the completion of melting to 340-380° C. Cu primarily forms Cu3Sn and Cu6Sn5, thereby suppressing the formation of a low melting point phase and increasing the strength of a solder alloy.

If the Cu content is less than 6%, it is not possible to exhibit the effect of the addition of Cu. If the Cu content is greater than 8%, Sb and Cu preferentially form a precipitated phase, and a Cu2Sb phase appears in the initial stage of the solidification of a solder alloy. As a result, a low melting point phase easily forms in a solder alloy.

If Sb and Cu form a precipitated phase in the initial stage of solidification of a solder alloy, the concentrations of Sb and Cu in the liquid phase which remains during the course of solidification of the solder alloy become relatively low. If the concentrations of Sb and Cu in the remaining liquid phase decrease, the effects of Sb and Cu of suppressing the formation of a low melting point phase decrease, and a low melting point phase forms at 250° C. or below. As a result, the heat resistance of the solder alloy deteriorates. When Cu exceeds 8%, the liquidus temperature of the solder alloy increases and wettability worsens, as a result of which solderability worsens. The Cu content is preferably 6-7.5% and more preferably 6-7%.

From the standpoint of suppressing the formation of a low melting point phase due to solidification segregation with greater certainty, the ratios of elements in the alloy composition of the solder alloy preferably satisfy all the relationships represented by Equations (I)-(III).

$$2.20 \leq Sb/Ag \leq 2.75 \quad (I)$$

$$4.90 \leq Sb/Cu \leq 6.20 \quad (II)$$

$$2.05 \leq Ag/Cu \leq 2.55 \quad (III)$$

Sb, Ag, and Cu indicate the contents (%) of Sb, Ag, and Cu.

The reason why a single-Sn phase is not formed when these conditions are satisfied is unclear. However, it is thought that when the relations given by to Equations (I)-(III) are satisfied, solidification of a solder alloy is completed without upsetting the sequence and balance of formation of nuclei and their growth and coarsening which occur during a solidification process.

If these relationships are not satisfied and the concentration of Sn increases, a low melting point phase which has a melting point of 250° C. or lower and which predominantly comprises Sn easily develops. In particular, if the relationship between Ag and Cu given by Equation (III) is not satisfied, as stated above, an Ag3Sb phase or a Cu2Sb phase, each of which is a phase having a higher melting point than SnSb, is preferentially formed, and it is thought that it becomes easier for a low melting point phase to form.

In addition to the above-described essential elements, Ni may be added as an optional element in the present invention.

The Ni content is preferably 0.01-0.1%. Ni prevents diffusion from electrodes into a solder alloy to suppress erosion of electrodes. The Ni content is more preferably 0.01-0.07% and particularly preferably 0.03-0.07%.

The proportion of solid phases at 280° C. of a solder alloy according to the present invention is 100%, and the solder alloy does not form a low melting point phase at 210-250° C. during soldering. More preferred ranges are $2.20 \leq Sb/Ag \leq 2.70$, $5.00 \leq Sb/Cu \leq 6.20$, and $2.10 \leq Ag/Cu \leq 2.50$.

The term "proportion of solid phases" used herein is the percentage of the area of the endothermic peaks detected at 280° C. or above with respect to the total area of the endothermic peaks measured on a DSC curve.

Thus, a high-temperature lead-free solder alloy according to the present invention consists exclusively of a high melting point phase comprising intermetallic compounds which exhibit a temperature at the start of melting of at least 290° C. when the solder alloy is cooled and solidified from a temperature of at least the temperature at the completion of melting. As a result, there is no formation of a low melting point phase.

One reason why the temperature at the start of melting is defined as at least 280° C. and preferably as at least 290° C. is that a solder joint using a high-temperature lead-free solder alloy according to the present invention will have sufficient heat resistance to resist heat generation by SiC semiconductor elements, Ga Semiconductor elements, and GaAs semiconductor elements which operate at a high-temperature of 250° C. or higher, so that it will have a proportion of solid phases of 100% and guarantee good reliability. Another reason why the temperature at the start of melting is defined as at least 280° C. and preferably at least 290° C. is that after a semiconductor element is bonded to a mounting substrate, the reflow temperature is 260° C. when other electronic parts are bonded to the mounting substrate in subsequent steps. It is desired that a solder alloy joint have a temperature at the start of melting of at least 280° C. and preferably at least 290° C. in order to sufficiently cope with such reflow temperatures without remelting.

A solder alloy according to the present invention preferably has a temperature at the completion of melting of at most 400° C. The soldering temperature needs to be higher than the temperature at the completion of melting. Therefore, if the temperature at the completion of melting is higher than 400° C., it is necessary for the soldering temperature to be higher than 400° C., and at such a high temperature, the running costs during production become high and operability becomes poor. From the standpoints of the heat resistance of semiconductor parts themselves and protecting circuits and wiring inside semiconductor parts, the temperature at the completion of melting is more preferably at most 380° C.

A high-temperature lead-free solder alloy according to the present invention can be used for die bonding of semiconductor elements, namely, for bonding of semiconductor elements to heat sinks. A high-temperature lead-free solder alloy according to the present invention can also be applied to soldering of connector terminals or motherboards, to mounting of DIP IC packages or the like on printed circuit boards, to assembly and mounting of electronic parts such as capacitors, to sealing of ceramic packages, to attachment of leads to diodes and the like, and to preforms for semiconductors.

A high-temperature lead-free solder alloy according to the present invention can be suitably used as a preform or in a solder paste. Examples of the shape of preforms include washers, rings, pellets, discs, ribbons, and wires.

A solder preform can be used for bonding in a reducing atmosphere without using a flux. Bonding in a reducing atmosphere does not cause contamination of joints after bonding, so it has the advantages that not only does it become to unnecessary to clean joints after bonding but also that voids in solder joints can be greatly decreased.

A high-temperature lead-free solder alloy according to the present invention can be used in a solder paste. A solder paste is formed by mixing a solder alloy powder with a small amount of a flux to obtain a paste. A high-temperature lead-free solder alloy according to the present invention can be used in the form of a solder paste when mounting electronic parts on a printed circuit board by the reflow soldering method. A flux used in a solder paste can be either a water soluble flux or a non-water soluble flux. Typically a rosin flux which is a rosin-based non-water soluble flux is used.

Figure 1:
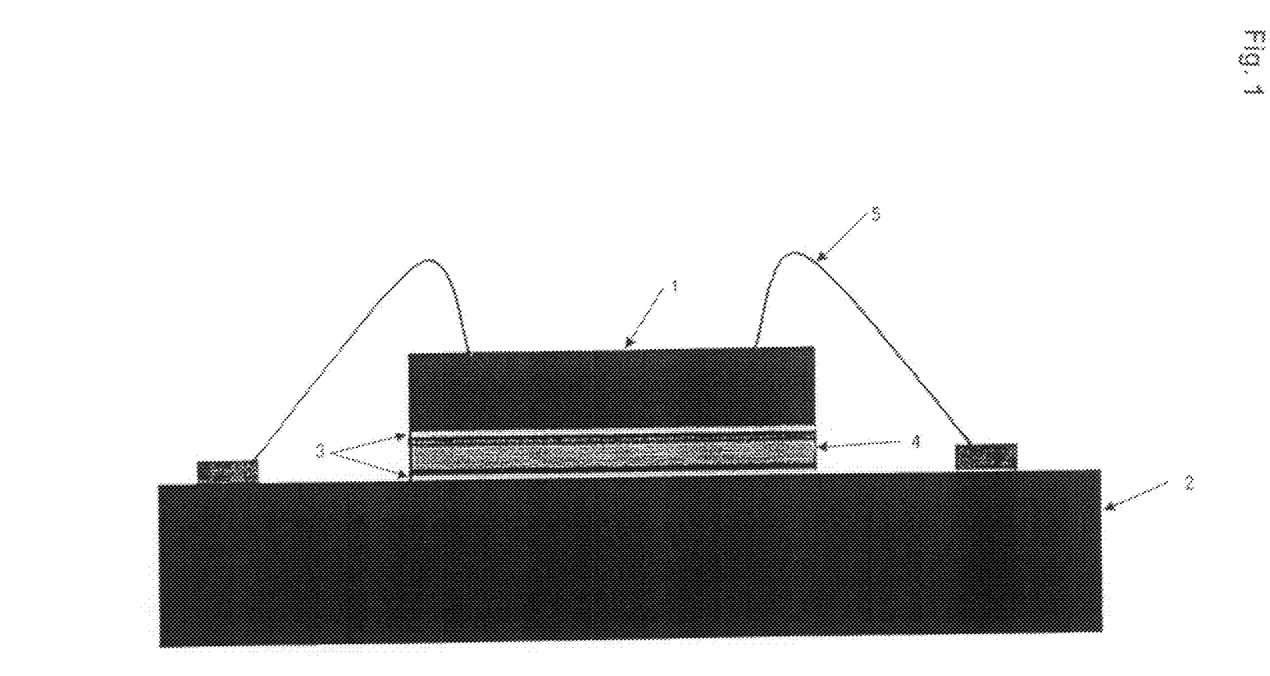
FIG. 1 is a schematic diagram showing an example of mounting using a high-temperature lead-free solder alloy according to the present invention.

FIG. 1 is a schematic illustration showing an embodiment using a high-temperature lead-free solder alloy according to the present invention for mounting. A high-temperature lead-free solder alloy according to the present invention can be used as a high-temperature solder alloy for bonding (die bonding) a semiconductor element to a heat sink. As shown in FIG. 1, both a semiconductor element 1 and a heat sink 2 has a plating layers 3 made of Cu, Ni, Ni/Au, Ag, or the like. A high-temperature lead-free solder alloy 4 according to the present invention connects the plating layers 3 to each other and forms a solder joint.

A cooling rate at the time of solidification of 0.8-50° C. per second is preferred as a manufacturing condition for a solder joint using a high-temperature lead-free solder alloy according to the present invention. A cooling rate in this range covers the cooling rate of most soldering equipment currently used for mounting. Therefore, when using a solder alloy according to the present invention, it is not necessary to make any particular changes, particularly to the cooling rate after soldering. Due to such excellent effects of the present invention, even when a semiconductor element is bonded to a large printed circuit board or heat sink having a large heat capacity using a high-temperature solder according to the present invention, it is not necessary to change the cooling rate, and soldering can be carried out using conventional cooling conditions. This is because a solder alloy according to the present invention can exhibit excellent connection reliability without forming a low melting point phase even when undergoing slow cooling at 0.8° C. per second. The cooling rate is more preferably 1-10° C. per second.

A high-temperature lead-free solder alloy according to the present invention exhibits its effects particularly when bonding a semiconductor element as stated above which has an operating temperature of around 250-280° C. to a heat sink by the reflow method. Of course, a high-temperature lead-free solder alloy according to the present invention does not form a low melting point phase and can exhibit sufficiently high connection reliability even when used for a solder joint having a heat resistance temperature of at most 250° C.

EXAMPLES

Solder alloys having the alloy compositions shown in Table 1 were melted at 430° C., and then each solder alloy was cooled at a cooling rate of 1° C. per second. The temperatures were controlled by a DSC. Specifically, the cooling rate of 1° C. per second was the value measured when the solder alloy was heated at a rate of temperature increase of 5° C. per second to 430° C. at which the alloy was completely melted, and then cooled to 180° C. at a rate of temperature decrease of 1° C. per second.

A DSC curve of the resulting solder alloy after cooling was obtained using a model Q2000 DSC made by TA Instruments Japan Inc. at a rate of temperature increase of 5° C. per minute in air. From the resulting DSC curve, the temperature at the start of melting, the temperature at the completion of melting, the proportion of liquid phases, and the proportion of solid phases were determined. The results are compiled in Table 1.

Figure 2:
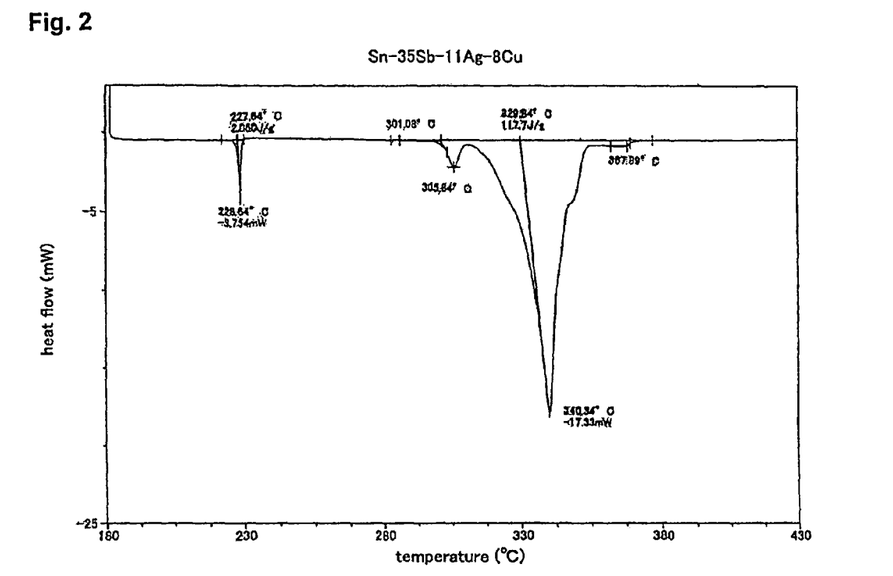
FIG. 2 is a graph showing a DSC curve of the solder alloy of Comparative Example 14.
Figure 3:
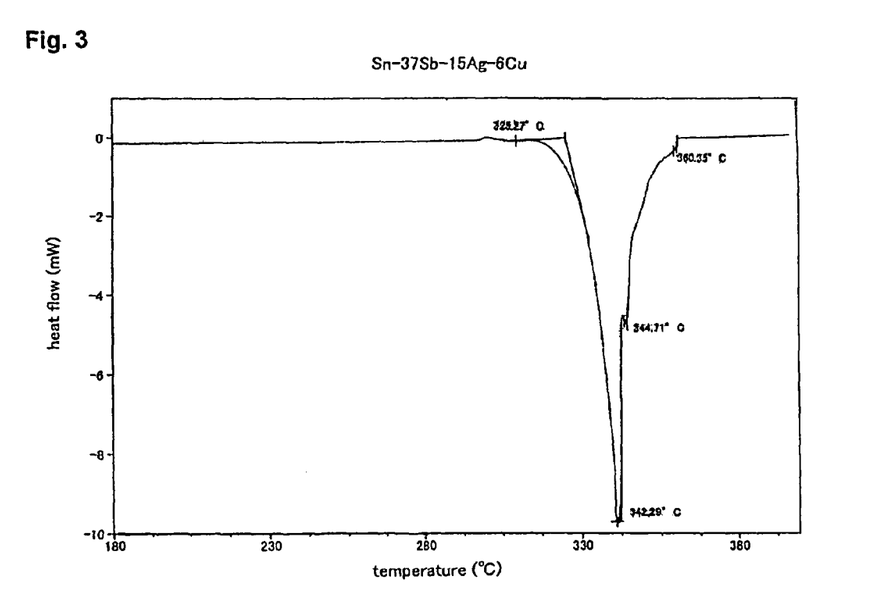
FIG. 3 is a graph showing a DSC curve of the solder alloy of Example 2.

FIG. 2 is a graph showing a DSC curve of the solder alloy of Comparative Example 14. FIG. 3 is a graph showing a DSC curve of the solder alloy of Example 2.

In the DSC curve shown in FIG. 2, the temperature at the start of endotherm of the initial endothermic peak is the temperature at the start of melting, and the temperature at the completion of endotherm of the final endothermic peak is the temperature at the completion of melting. When there is only one endothermic peak as shown in FIG. 3, the temperature at the start of endotherm of the sole endothermic peak is the temperature at the start of melting, and the temperature at the completion of endotherm of this endothermic peak is the temperature at the to completion of melting.

As is clear from FIG. 2, with the solder alloy of Comparative Example 14 for which the alloy composition was outside the range of the present invention, two endothermic peaks were observed, and the temperature at the start of melting was 228° C. In contrast, as is clear from FIG. 3, with the solder alloy of Example 2 having an alloy composition in the range of the present invention, only one endothermic peak was observed, and the temperature at the start of melting was 325° C.

Figure 4:
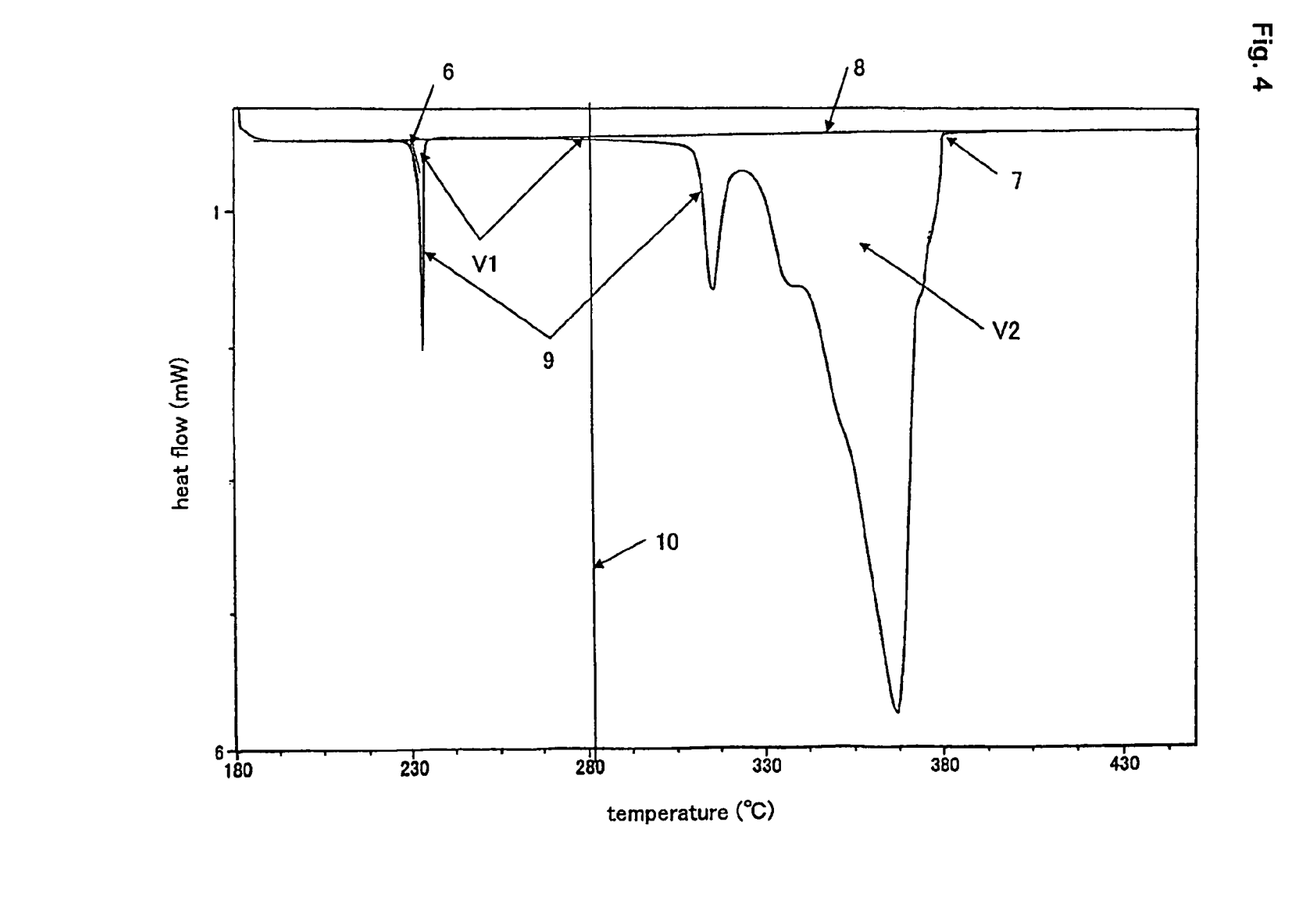
FIG. 4 is a graph showing a DSC curve of the solder alloy of Comparative Example 7.

FIG. 4 is a graph showing a DSC curve of the solder alloy of Comparative Example 7. The DSC curve shown in FIG. 4 differs from the DSC curve shown in FIG. 2 in that an endothermic reaction was observed between the first endothermic peak and the second endothermic peak. This is thought to be because among solder alloys in which an endothermic peak is observed at a temperature lower than 280° C., solder alloys having relatively low contents of Ag and Cu form a solid-liquid coexisting phase in the periphery of a liquid phase, which is a low melting point phase formed first. On the other hand, with a solder alloy like that of Comparative Example 14 having a relatively large contents of Cu and Ag, as shown in FIG. 2, an endothermic reaction which is caused by a solid-liquid coexisting phase was not observed. In this manner, due to the compositions of the comparative examples, the DSC curves were somewhat different depending upon whether there was an endothermic reaction. However, an endothermic peak was observed at a temperature lower than 280° C. for all the compositions of the comparative examples. As shown in FIG. 4, the temperature at the start of melting 6 is the temperature at the start of endotherm for the first endothermic peak, and the temperature at the completion of melting 7 is the temperature at the completion of endotherm for the endothermic peak which was detected at a temperature of 280° C. or above.

The method of calculating the proportion of liquid phases and the proportion of solid phases will be explained in detail taking the DSC curve of FIG. 4 as an example.

The proportion of liquid phases was determined in the following manner. First, as shown in FIG. 4, a baseline 8 was drawn, and the area $V_0$ ($V_0=V_1+V_2$) surrounded by the baseline 8 and the DSC curve 9 was determined. A dividing line 10 was then drawn at 280° C., and the area $V_1$ surrounded by the dividing line 10, the DSC curve 9 at or below 280° C., and the baseline 8 was determined. Finally, the proportion of liquid phase at 280° C. was calculated as $(V_1/V_0)\times100$. As shown in FIG. 3, when an endothermic peak at a temperature of 280° C. or below is not observed, area $V_1$ is 0, so the proportion of liquid phases at 280° C. becomes 0%.

The proportion of solid phases was determined as follows. As shown in FIG. 4, the area $V_2$ surrounded by the dividing line 10, the DSC curve 9 at or above 280° C., and the baseline 8 was determined. The proportion of liquid phases at 280° C. was then calculated to obtain the proportion of solid phases as $(V_2/V_0)\times100$. As shown in FIG. 3, when an endothermic peak was observed only at 280° C. or above, $V_2=V_0$, so the proportion of solid phases at 280° C. becomes 100%.

TABLE 1

| | Alloy composition [%] | | | | | | | | Temp. at the start of melting [° C.] | Temp. at the completion of melting [° C.] | Proportion of liquid phases [%] | Proportion of solid phases [%] |
|---|---|---|---|---|---|---|---|---|---|---|---|---|
| | Sn | Sb | Ag | Cu | Ni | Sb/Ag | Sb/Cu | Ag/Cu | | | | |
| Ex. 1 | 46 | 35 | 13 | 6 | | 2.69 | 5.83 | 2.17 | 299 | 340 | 0.0 | 100.0 |
| Ex. 2 | 42 | 37 | 15 | 6 | | 2.47 | 6.17 | 2.50 | 325 | 360 | 0.0 | 100.0 |
| Ex. 3 | 41.9 | 37 | 15 | 6 | 0.1 | 2.47 | 6.17 | 2.50 | 301 | 344 | 0.0 | 100.0 |
| Ex. 4 | 34 | 40 | 18 | 8 | | 2.22 | 5.00 | 2.25 | 337 | 375 | 0.0 | 100.0 |
| Comp. 1 | 70 | 30 | 0 | 0 | 0 | — | — | — | 240 | 362 | 32.3 | 67.7 |
| Comp. 2 | 65 | 30 | 0 | 5 | 0 | — | 6.00 | — | 239 | 354 | 20.4 | 79.6 |
| Comp. 3 | 60 | 40 | 0 | 0 | 0 | — | — | — | 243 | 397 | 8.0 | 92.0 |
| Comp. 4 | 50 | 50 | 0 | 0 | 0 | — | — | — | 242 | 428 | 2.3 | 97.7 |
| Comp. 5 | 56 | 34 | 10 | 0 | 0 | 3.40 | — | — | 227 | 364 | 12.8 | 87.2 |
| Comp. 6 | 50 | 35 | 15 | 0 | 0 | 2.33 | — | — | 231 | 374 | 6.7 | 93.3 |
| Comp. 7 | 48 | 37 | 15 | 0 | 0 | 2.47 | — | — | 215 | 378 | 2.0 | 98.0 |
| Comp. 8 | 52 | 40 | 0 | 8 | 0 | — | 5.00 | 0.00 | 239 | 389 | 1.3 | 98.7 |
| Comp. 9 | 55 | 35 | 0 | 10 | 0 | — | 3.50 | 0.00 | 238 | 400 | 7.2 | 92.8 |
| Comp. 10 | 43 | 30 | 20 | 7 | 0 | 1.50 | 4.29 | 2.86 | 228 | 377 | 1.8 | 98.2 |
| Comp. 11 | 56 | 34 | 5 | 5 | 0 | 6.80 | 6.80 | 1.00 | 228 | 354 | 8.8 | 91.2 |
| Comp. 12 | 31 | 34 | 17.5 | 17.5 | 0 | 1.94 | 1.94 | 1.00 | 338 | 435 | 1.0 | 99.0 |
| Comp. 13 | 50 | 35 | 10 | 5 | 0 | 3.50 | 7.00 | 2.00 | 228 | 360 | 2.8 | 97.2 |
| Comp. 14 | 46 | 35 | 11 | 8 | 0 | 3.18 | 4.38 | 1.38 | 228 | 368 | 1.7 | 98.3 |
| Comp. 15 | 46 | 36 | 12 | 6 | 0 | 3.00 | 6.00 | 2.00 | 227 | 356 | 1.4 | 98.6 |
| Comp. 16 | 34 | 38 | 20 | 8 | 0 | 1.90 | 4.75 | 2.50 | 226 | 367 | 0.2 | 99.8 |
| Comp. 17 | 34 | 39 | 19 | 8 | 0 | 2.05 | 4.88 | 2.38 | 226 | 369 | 0.2 | 99.8 |
| Comp. 18 | 46 | 35 | 15 | 4 | 0 | 2.33 | 8.75 | 3.75 | 227 | 354 | 0.5 | 99.5 |
| Comp. 19 | 46 | 36 | 13 | 5 | 0 | 2.77 | 7.20 | 2.60 | 228 | 358 | 0.2 | 99.8 |
| Comp. 20 | 34 | 39 | 18 | 9 | 0 | 2.17 | 4.33 | 2.00 | 227 | 370 | 0.2 | 99.8 |
| Comp. 21 | 32 | 40 | 18 | 10 | 0 | 2.22 | 4.00 | 1.80 | 226 | 380 | 0.2 | 99.8 |

Ex = Example;
Comp. = Comparative Example

For each of the solder alloys of Examples 1-4 for which the alloy composition was within the range of the present invention, the temperature at the start of melting was at least 299° C., and the temperature at the completion of melting was at most 375° C. Furthermore, regardless of the cooling rate of the solder alloy, the proportion of the solid phases was 100%. For the solder alloys of Examples 1-4, it was ascertained that the proportion of solid phases was 100% even at a cooling rate of 0.8° C. per second. Particularly with the solder alloy of Example 4, it was confirmed that the proportion of solid phases was 100% even when the cooling rate was 0.1° C. per second.

In contrast, for each the solder alloys of Comparative Examples 1, 3, and 4 which did not contain Ag and Cu, each of the solder alloys of Comparative Examples 5-7 which did not contain Cu, and each of the solder alloys of Comparative Examples 2, 8, and 9 which did not contain Ag, the alloy composition was outside the range of the present invention, the temperature at the start of melting was a low value of around 230° C., and the proportion of solid phases was less than 100% when the cooling rate was 1° C. per second.

In the same manner as the solder alloys of Comparative Examples 1-9, none of the solder alloys of Comparative Examples 10-12 which had a Sb content outside the range of the present invention, none of the solder alloys of Comparative Examples 13-17 which had an Ag content outside the range of the present invention, and none of the solder alloys of Comparative Examples 18-21 which had a Cu content outside the range of the present invention satisfied the temperature at the start of melting and the proportion of solid phases. In addition, for the solder alloys of Comparative Examples 4, 9, and 12, the temperature at the completion of melting exceeded 400° C. and the proportion of solid phases was less than 100%.

Thus, it was found that a solder alloy according to the present invention exhibits a high temperature at the start of melting without forming a low melting point phase.

Next, based on the results shown in Table 1, the effect of the Ag content and the Cu content on the temperature at the start of melting will be explained. First, the relationship between the Ag content and the temperature at the start of melting will be explained for the case in which the content of Sn, which is the main component of a low melting point phase, and the content of Cu, which suppresses the formation of a low melting point phase, are fixed.

Concerning the lower limit of Ag, the solder alloy of Example 1 and the solder alloy of Comparative Example 15 were compared. The alloy compositions of both solder alloys had a Sn content of 46% and a Cu content of 6%. The temperature at the start of melting was 299° C. for the solder alloy of Example 1 which had an Ag content of 13%, while the temperature at the start of melting was 227° C. for the solder alloy of Comparative Example 15 which had an Ag content of 12%.

Concerning the upper limit of Ag, the solder alloy of Example 4 and the solder alloy of Comparative Example 17 were compared. The alloy compositions of both solder alloys had a Sn content of 34% and a Cu content of 8%. The temperature at the start of melting was 337° C. for the solder alloy of Example 4 which had an Ag content of 18%, whereas the temperature at the start of melting was 226° C. for the solder alloy of Comparative Example 17 which had an Ag content of 19%.

Thus, it became clear that when the Sn and Cu contents are constant, a high temperature at the start of melting is exhibited when the Ag content is 13-18%.

Next, the relationship between the Cu content and the temperature at the start of melting will be explained when the Sn content and the Ag content are fixed.

Concerning the lower limit of Cu, the solder, alloy of Example 1 and the solder alloy of Comparative Example 19 were compared. The alloy compositions of both solder alloys had a Sn content of 46% and an Ag content of 13%. The temperature at the start of melting was 299° C. for the solder alloy of Example 1 which had a Cu content of 6%, whereas the temperature at the start of melting was 228° C. for Comparative Example 19 which had a Cu content of 5%.

Concerning the upper limit of Cu, the solder alloy of Example 4 and the solder alloy of Comparative Example 20 were compared. The alloy compositions of both solder alloys had a Sn content of 34% and an Ag content of 18%. The temperature at the start of melting was 337° C. for the solder alloy of Example 4 which had a Cu content of 8%, whereas the temperature at the start of melting was 227° C. for the solder alloy of Comparative Example 20 which had a Cu content of 9%.

Thus, it became clear that when the Sn and Ag contents are constant, a high temperature at the start of melting is exhibited when the Cu content is 6-8%.

As shown in Table 1, the solder alloys of Examples 1-4 satisfied above Equations (I)-(III), and a low melting point phase was not formed even when cooling was performed at 1° C. per second. In contrast, with the solder alloys of Comparative Examples 1-21, at least one of Sb/Ag, Sb/Cu, and Ag/Cu ratios did not fall into the above-described ranges, and a low melting point phase was formed when cooling was carried out at 1° C. per second.

As described above, because a solder alloy according to the present invention has prescribed contents of Ag and Cu in a Sn—Sb solder alloy, it has a high temperature at the start of melting, and it is possible to suppress the formation of a low melting point phase even when the cooling rate is low at the time of mounting. In this manner, a solder alloy according to the present invention allows a wide range of cooling rates necessary for soldering, so control of mounting conditions is easy, and the solder alloy can be applied to various types of substrates and parts having different heat capacities.

The invention claimed is:

1. A high-temperature lead-free solder alloy consisting essentially of 35-40 mass % of Sb, 13-18 mass % of Ag, 6-8 mass % of Cu, and a remainder of Sn, wherein the ratios of the contents of the alloy composition satisfy the following Formulas (I)-(III):

$$2.20 \leq Sb/Ag \leq 2.75 \qquad (I)$$

$$4.90 \leq Sb/Cu \leq 6.20 \qquad (II)$$

$$2.05 \leq Ag/Cu \leq 2.55 \qquad (III).$$

2. A high-temperature lead-free solder alloy as claimed in claim 1 further containing 0.01-0.1 mass % of Ni.

3. A solder joint using a high-temperature lead-free solder alloy as claimed in claim 1 wherein the proportion of solid phases of the solder alloy at 280° C., which is the percentage of the area of endothermic peaks detected at 280° C. and above in a DSC curve of the alloy during melting with respect to the total area of endothermic peaks in the DSC curve, is 100%.

4. A solder preform made of a high-temperature lead-free solder alloy as claimed in claim 1.

5. A solder paste comprising a powder of a high-temperature lead-free solder alloy as claimed in claim 1 mixed with a flux.

6. A high-temperature lead-free solder alloy as claimed in claim 1 containing 37-40 mass % of Sb.

7. A high-temperature lead-free solder alloy as claimed in claim 1 containing 15-18 mass % of Ag.

8. A high-temperature lead-free solder alloy as claimed in claim 1 containing 6-7 mass % of Cu.

9. A high-temperature lead-free solder alloy as claimed in claim 2 containing 0.03-0.07 mass % of Ni.

10. A high-temperature lead-free solder alloy as claimed in claim 1 wherein $2.20 \leq Sb/Ag \leq 2.70$, $5.00 \leq Sb/Cu \leq 6.20$, and $2.10 \leq Ag/Cu \leq 2.50$.

11. A high-temperature lead-free solder alloy as claimed in claim 1 wherein the temperature at the start of melting of the alloy, which is the temperature at the start of endotherm of the initial endothermic peak in a DSC curve of the alloy during melting of the alloy, is at least 280° C.

12. A high-temperature lead-free solder alloy as claimed in claim 11 wherein the temperature at the start of melting of the alloy is at least 290° C.

13. A high-temperature lead-free solder alloy as claimed in claim 1 wherein the temperature at the completion of melting of the alloy, which is the temperature at the completion of endotherm of the final endothermic peak in a DSC curve of the alloy during melting of the alloy, is at most 400° C.

14. A high-temperature lead-free solder alloy as claimed in claim 13 wherein the temperature at the completion of melting of the alloy is at most 380° C.

15. A high-temperature lead-free solder alloy as claimed in claim 1 consisting of 35-40 mass % of Sb, 13-18 mass % of Ag, 6-8 mass % of Cu, and a remainder of Sn.

16. A high-temperature lead-free solder alloy as claimed in claim 1 consisting of 35-40 mass % of Sb, 13-18 mass % of Ag, 6-8 mass % of Cu, 0.01-0.1 mass % of Ni, and a remainder of Sn.

17. A high-temperature lead-free solder alloy as claimed in claim 1 consisting of 35-40 mass % of Sb, 13-18 mass % of Ag, 6-8 mass % of Cu, optionally 0.01-0.1 mass % of Ni, and a remainder of Sn.

* * * * *